United States Patent
Mason

(10) Patent No.: US 6,335,482 B1
(45) Date of Patent: Jan. 1, 2002

(54) CABLE SCREEN CONNECTION METHOD AND CABLE GROMMET

(75) Inventor: James Stephen Baynham Mason, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/477,294

(22) Filed: Jan. 4, 2000

(30) Foreign Application Priority Data

Feb. 19, 1999 (GB) .................................................. 9903732

(51) Int. Cl.[7] ................................ H05K 9/00; H02G 3/18
(52) U.S. Cl. ..................... 174/35 R; 174/35 C; 174/65 G
(58) Field of Search .............................. 174/35 C, 35 R, 174/35 GC, 35 MS, 65 R, 65 G, 152 G, 153 G, 75 C, 78; 439/927, 939, 607, 608, 609, 610

(56) References Cited

U.S. PATENT DOCUMENTS

| | | | |
|---|---|---|---|
| 5,170,008 A | | 12/1992 | Evans et al. .................... 174/35 |
| 5,371,819 A | * | 12/1994 | Szegda ............................ 385/75 |
| 5,456,614 A | * | 10/1995 | Szegda .......................... 439/321 |
| 6,089,912 A | * | 7/2000 | Tallis et al. .................... 439/584 |
| 6,119,305 A | * | 9/2000 | Loveall et al. .................. 16/2.2 |

* cited by examiner

Primary Examiner—Dean A. Reichard
Assistant Examiner—Carmelo Oliva
(74) Attorney, Agent, or Firm—Lawrence R. Fraley

(57) ABSTRACT

A method is provided for EMC screening of a cable connection to an electrical apparatus that includes an enclosure defining an opening for the cable, the enclosure including a conductive internal wall to which a screen portion of the cable is to be electrically connected. The method includes (i) folding back a portion of cable screen along the length of the cable; (ii) positioning (e.g., inserting) the cable into a sleeved grommet including a conductive elastomeric material and having an inner surface, the grommet being sized so as to compress the folded back cable portion against the conductive inner surface of the grommet. The grommet further includes a circumferential groove in an outer surface thereof for being positioned in the enclosure opening so that the groove holds the grommet in the opening and the conductive material of the grommet is in direct electrical contact with the conductive internal wall of the enclosure. The grommet may include silicone elastomeric material having a silver/glass conductive filler.

8 Claims, 2 Drawing Sheets

CABLE SCREEN CONNECTION METHOD AND CABLE GROMMET

TECHNICAL FIELD

The present invention relates generally to the connection of external cables to electrical apparatus and more particularly to a cable screen connection method and sleeved cable grommet for use in such a method.

BACKGROUND OF THE INVENTION

Within electronic products, it is often necessary for equipment to directly connect to cables which then connect to remote equipment. In some applications, it is necessary for the cable to directly pass through the enclosure of the equipment without an intermediate connector and to directly connect to the circuitry within the enclosure. It is often necessary to provide screening for EMC (Electromagnetic Compatibility) performance around both the cable and the enclosure, an example being the use of braid or a metallic screen around the cable which then connects to a metallic surface on the inside of the enclosure to provide an overall screen for the equipment.

The conventional solution to the problem of connecting the cable screen to the enclosure screen has been to connect the cable screen onto a printed circuit board, or other electrical connection system, and then to connect onto the enclosure screen through some form of electrical contact. The effectiveness of the screening is reduced at high frequencies due to the electrical parasitic components introduced in the connection between the cable screen and the enclosure.

One prior technique is shown in U.S. Pat. No. 5,170,008 which describes a technique for connecting the braided shielding of a shielded cable to the frame of an EMI shielded metal enclosure by means of a grommet formed of an elastomer which includes a symmetrically formed metal band connecting the shield braid to the enclosure frame.

It is believed that an improved cable screen connection method would represent an advancement in the art.

OBJECTS AND SUMMARY OF THE INVENTION

It is, therefore, a primary object of the invention to provide an improvement in the cable connection art.

It is another object to provide an enhanced cable connection which can be effectively produced at reasonable costs and which can be readily practiced by those skilled in the art.

According to a first aspect of the invention, there is provided a method for providing EMC screening of a cable connection to an electrical apparatus comprising providing an electrically conductive screen layer on the internal wall of the enclosure adjacent the opening, providing a cable having a plurality of internal wires and a screen portion, folding back a portion of the screen portion along the cable, positioning the cable within a sleeved grommet comprised of an electrically conductive material having a conductive inner surface, the grommet being sized so as to compress the folded back screen portion of the cable against the conductive inner surface of the grommet, the grommet further including a groove within an outer surface thereof, and positioning the grommet and the cable within the opening of the enclosure so that the internal wall surrounding the opening fits within the groove to hold the grommet and cable in the opening and the conductive material of the grommet in direct electrical contact with the conductive screen layer on the internal wall of the enclosure.

According to a second aspect of the invention, there is provided a grommet for providing EMC screening of a cable connection to an electrical apparatus comprising an electrically conductive material of sufficient size so as to be compressed onto and provide electrical connection to a folded back screen portion of the cable, the grommet further including an external groove therein adapted for being positioned within the opening of the internal wall of the enclosure so that the grommet will be in direct electrical contact with the conductive screen coating on the internal wall.

The method and grommet of the present invention provides for a simpler and cheaper cable connection technique compared to the technique described in U.S. Pat. No. 5,170,008. The grommet of the present invention is so formed that there is no need to provide a metal band as is shown in the aforementioned patent. By avoiding the need for a metal band, this does away with a point of failure in the electrical connection. In addition, as will be apparent from the following description, the invention provides a convenient means of connection to the internal EMC screen of a plastic or other non-conductive equipment enclosure, the grommet of U.S. Pat. No. 5,170,008 designed for use instead with a metal (conductive) enclosure.

A wide range of suitable conductive elastomeric materials are available and the material chosen depends on the electrical environment in which the grommet is used. For computer applications operating with clock rates of several hundred megahertz, a silicone elastomer with a silver/glass conductive filler may be successfully used.

Thus in the present invention, the cable screen makes connection to a sleeved grommet component which is itself conductive and the grommet makes contact to the screen of the enclosure of the equipment to which the cable is connecting. In this way, a screen is maintained around the complete cable and equipment system which has the capability to be effective at a very high frequencies, e.g., greater than 100 MHz.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals may be used to indicate like elements from FIG. to FIG.

Figure 1A:
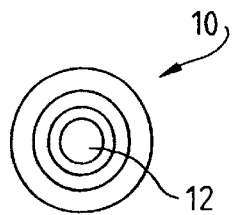
FIGS. 1A and 1B are schematic representations of side and end-on views of a sleeved cable grommet in accordance with the preferred embodiment of the present invention.
Figure 1B:
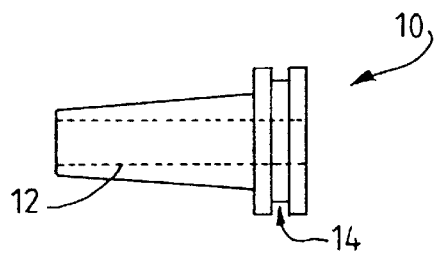

With reference to FIGS. 1A and 1B, there is shown a schematic representation of a conductive sleeved grommet 10 in side and end-on views. As can be seen, the grommet is generally conical in shape with a cylindrical central bore 12 extending the length of the grommet. At one end of the grommet, there is provided an external groove 14 extending circumferentially around the grommet.

Significantly, the grommet is preferably comprised of an electrically conductive elastomer material and is designed such that the cable screen can be connected through the internal bore of the grommet. A wide range of conductive elastomer materials are available and the material chosen will depend on the environment in which the grommet is used, availability, costs and performance. For computer applications operating with clock rates of several hundred megahertz (MHz), a silicone elastomer with a silver/glass conductive filler has been found to be suitable. This material can typically be manufactured with a volume resistivity of 0.01 ohm-cm and a shielding effectiveness of 100 dB at 500 MHz (electric field). The material can be conveniently molded and it is thus possible to produce a sleeved grommet of the type shown in FIG. 1 at relatively low cost.

With reference to FIGS. 2–5, next will be described the preferred method for securing the above cable to the invention's grommet to form a cable/grommet assembly, and for attaching this assembly to an opening defined in an item of electrical equipment.

Figure 2:
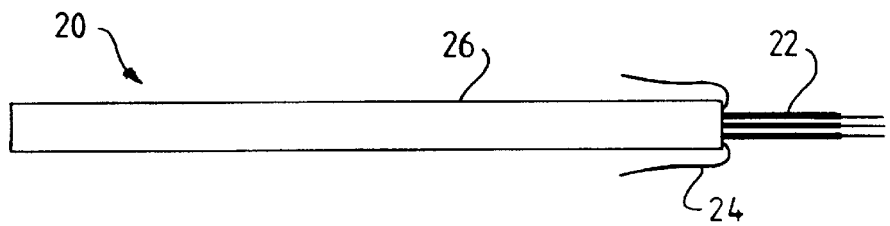
FIG. 2 shows a cable prior to insertion in the cable grommet of FIGS. 1A and 1B.
Figure 3:
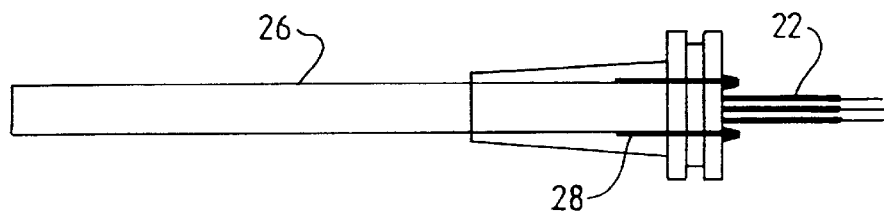
FIG. 3 shows a cable/grommet assembly including the cable of FIG. 2 inserted into the grommet of FIGS. 1A and 1B.
Figure 5:
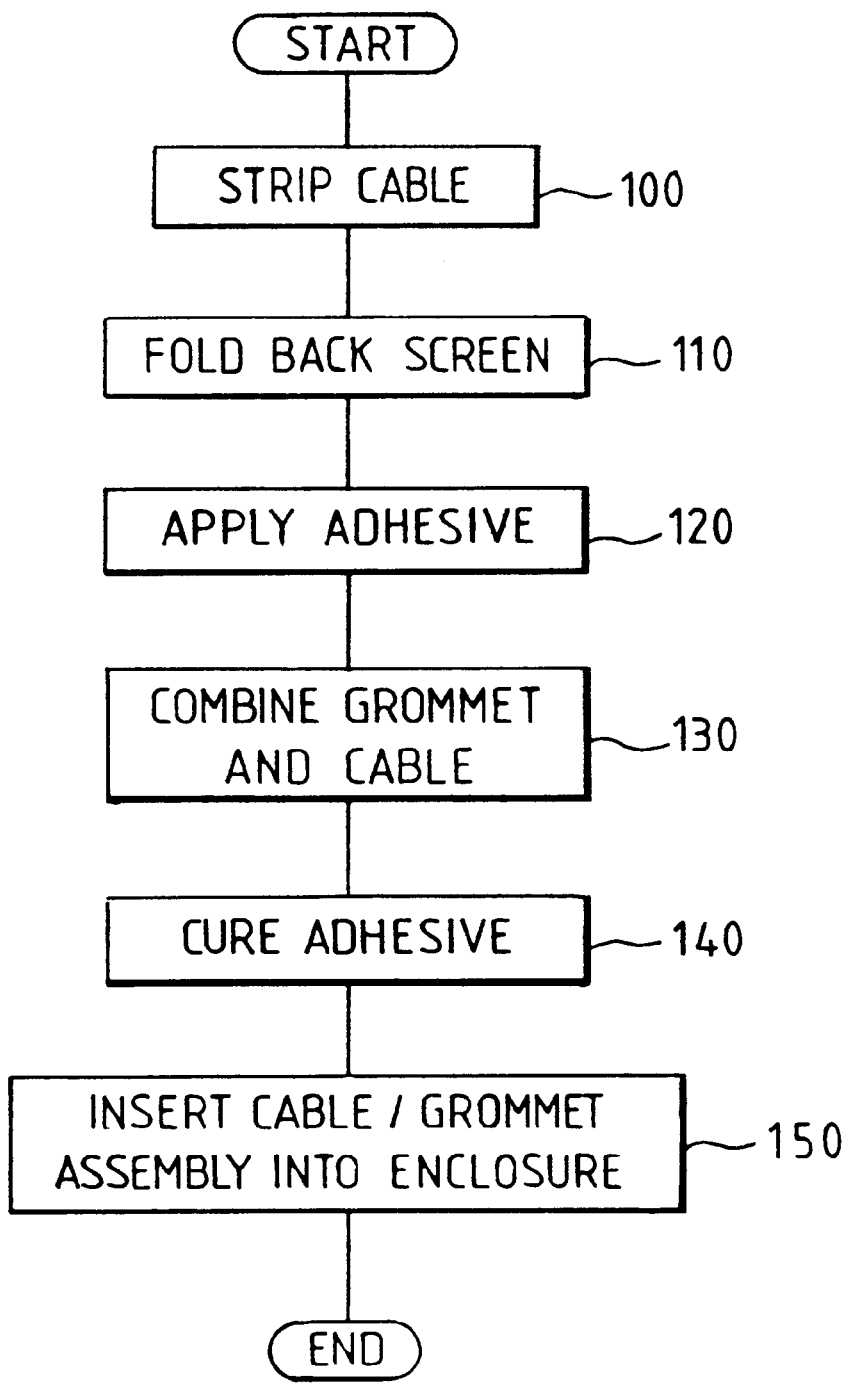
FIG. 5 is a flow diagram of the method steps involved in attaching the cable to the grommet and attaching the cable/grommet assembly to the enclosure.

As shown in FIG. 2 and set out in FIG. 5, the cable 20 connecting to the equipment is stripped (step 100) such that the internal wires 22 are of the required length. The cable screen 24 is pulled back over the sheath 26 of the cable and cut to a length which is covered by the sleeve of the grommet.

A conductive adhesive 28 (FIG. 3) is used to secure the cable to the grommet and this is applied to the area of the cable screen and sheath that is covered by the grommet sleeve (step 120). There are many suitable electrically conductive adhesives available, a preferred adhesive using a silicone binder and a silver and glass conductive filler. This has been found to offer satisfactory electrical and mechanical performance and is convenient to apply in a manufacturing environment. The grommet is then pushed over the end of the cable (step 130) and any excess adhesive is pushed to the end of the grommet where it can be removed prior to adhesive cure. With the grommet in position (FIG. 3), the adhesive is then cured (step 140). The cable/grommet assembly so-formed is now shown in FIG. 3.

Figure 4:
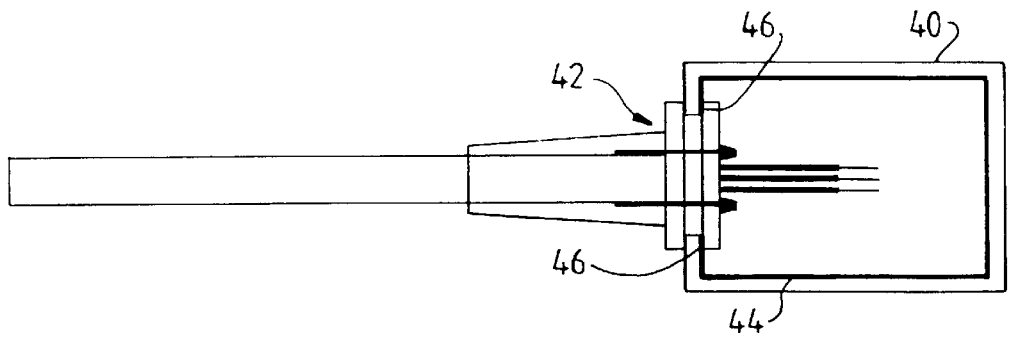
FIG. 4 is a schematic representation of the cable/grommet assembly of FIG. 3 mounted within the enclosure of an electronic apparatus.

The cable/grommet assembly is then installed into the electronic equipment as shown in FIG. 4. The equipment includes an enclosure 40 which is provided with an opening 42 for receiving the cable/grommet assembly. The opening is dimensioned such that it compresses the grommet to enable a satisfactory electrical connection to be made around the circumference of the grommet. The enclosure, which may be one of known types in the art, is made of a non-conductive material such as plastic and is provided with an internal EMC screen conductive layer 44 which is typically formed of a plated or sprayed conductive finish on the inside surfaces of the enclosure.

The cable/grommet assembly is inserted (step 150) into the opening until the groove 14 slots into the enclosure's opening and holds the assembly in place whereby the grommet is compressed to provide a tight fit between the grommet and enclosure opening. As indicated in FIG. 4 (by reference numeral 46), an electrical connection is thus provided between the forward wall of the grommet groove and the internal layer 44 of the enclosure. Understandably, the dimensions of the wall can be chosen to provide the required connective surface area.

It can thus be seen from FIG. 4 that there is provided an effective Faraday screen around the whole of the cable and connecting equipment. By using the elasticity of the grommet material, the grommet is made to contact a relatively large surface area of the internal screen as compared with other, more limiting methods of connection such as spring connections. This has the advantage of making the electrical contact more reliable and also reduces the impedance of the connection which can provide improved performance in electromagnetic screening.

The conductive grommet also provides advantages during manufacturing testing. If the internal conductive screen layer of the enclosure is not accessible externally then, under other methods of connecting the cable screen to the enclosure screen, it would be difficult to ensure that this connection was in place. However, with the invention described herein, the continuity can easily be measured between the cable screen at the far end of the cable and the grommet itself using a resistance measurement. Since the grommet is in mechanical contact with the enclosure and its internal screen, it follows that the internal screen is connected.

There have thus been shown and described a new and unique invention which provides a number of advantages. For example, the use of a sleeved conductive grommet allows simple connection between the cable screen and the inside surface of the grommet. Further, the use of conductive elastomer technology allows the production of a low cost, molded grommet with a high conductivity for screening applications. Still further, the grommet of the present invention provides for simpler connection onto the internal plating screen of a non-conductive enclosure. Other advantages are discernible from the teachings herein.

While there have been shown and described what are at present the preferred embodiments of the invention, it will be obvious to those skilled in the art that various changes and modifications may be made therein without departing from the scope of the invention as defined by the appended claims.

What is claimed is:

1. A method for providing electromagnetic capability screening of a cable connection to an electrical apparatus wherein said apparatus includes an enclosure having at least one internal wall having an opening therein, said method comprising:

providing an electrically conductive screen layer on said internal wall of said enclosure adjacent said opening;

providing a cable having a plurality of internal wires and a screen portion;

folding back a portion of said screen portion along said cable and applying an electrically conductive adhesive to the folded back screen portion of said cable;

positioning said cable with said folded back screen portion having said electrically conductive adhesive thereon within a sleeved grommet comprised of an electrically conductive material having a conductive inner surface, said grommet being sized so as to compress the folded back screen portion of said cable against said conductive inner surface of said grommet, said grommet further including a groove within an outer surface thereof; and positioning said grommet and said cable within said opening of said enclosure so that said internal wall surrounding said opening fits within said groove to hold said grommet and said cable in said opening and said conductive material of said grommet is in direct electrical contact with said conductive screen layer on said internal wall of said enclosure.

2. The method of claim 1 wherein said electrically conductive material of said grommet is comprised of an elastomer.

3. A grommet for providing electromagnetic capability screening for a cable positioned within an enclosure having an internal wall including a conductive screen coating thereon and an opening within said wall such that said grommet is adapted for being positioned within said opening of said enclosure, said grommet comprised of an electrically conductive material of sufficient size so as to be compressed onto and provide electrical connection to a folded back screen portion of said cable having an electrically conductive adhesive positioned on said folded back screen portion, said grommet further including an external groove thereon adapted for being positioned within said opening of said internal wall of said enclosure so that said grommet will be in direct electrical contact with said conductive screen coating on said internal wall.

4. The grommet of claim 3 wherein said electrically conductive material of said grommet is comprised of an elastomer.

5. The grommet of claim 4 wherein said elastomer material is silicone and includes an electrically conductive filler material therein.

6. The grommet of claim 5 wherein said electrically conductive filler material is a silver and glass composition.

7. A grommet for providing electromagnetic capability screening for a cable positioned within an enclosure having an internal wall including a conductive screen coating thereon and an opening within said wall such that said grommet is adapted for being positioned within said opening of said enclosure, said grommet comprised of an electrically conductive silicone elastomer material including an electrically conductive filler material therein, said elastomer material being of sufficient size so as to be compressed onto and provide electrical connection to a folded back screen portion of said cable, said grommet further including an external groove thereon adapted for being positioned within said opening of said internal wall of said enclosure so that said grommet will be in direct electrical contact with said conductive screen coating on said internal wall.

8. The grommet of claim 7 wherein said electrically conductive filler material is a silver and glass composition.

\* \* \* \* \*